United States Patent [19]
Myer

[11] Patent Number: 6,166,600
[45] Date of Patent: Dec. 26, 2000

[54] AUTOMATIC GAIN AND PHASE CONTROLLED FEEDFORWARD AMPLIFIER WITHOUT PILOT SIGNAL

[75] Inventor: Robert Evan Myer, Denville, N.J.

[73] Assignee: Lucent Technologies Inc., Murray Hill, N.J.

[21] Appl. No.: 09/144,163

[22] Filed: Aug. 31, 1998

[51] Int. Cl.$^7$ .................................................. H03F 1/26
[52] U.S. Cl. ........................................ 330/151; 330/149
[58] Field of Search ................................... 330/151, 149

[56] References Cited

U.S. PATENT DOCUMENTS

| | | | |
|---|---|---|---|
| 4,580,105 | 4/1986 | Myer | 330/149 |
| 4,583,049 | 4/1986 | Powell | 330/151 |
| 4,885,551 | 12/1989 | Myer | 330/52 |
| 4,926,136 | 5/1990 | Olver | 330/149 |
| 5,012,490 | 4/1991 | Myer | 375/58 |
| 5,304,945 | 4/1994 | Myer | 330/149 |
| 5,430,893 | 7/1995 | Myer | 455/209 |
| 5,619,168 | 4/1997 | Myer | 330/149 |
| 5,789,976 | 8/1998 | Ghannouchi et al. | 330/149 |
| 5,847,603 | 12/1998 | Myer | 330/52 |

OTHER PUBLICATIONS

Grant "A DSP Controlled Adaptive Feed Forward Amplifier Linearizer" pp 788–792 1996.

*Primary Examiner*—Michael Shingleton

[57] ABSTRACT

A pilotless feed forward distortion reduction system uses phase and gain control based on the phases and amplitudes of combining signals prior to a distortion isolation point to maintain the relationship between the phase and amplitudes of combining signals. For example, the feed forward arrangement receives a signal to be amplified on a main signal path and replicates the signal onto a main signal path and a feed forward path. The signal on the main signal path is applied to a gain & phase circuit. The output of gain & phase circuit is applied to the amplifier whose output comprises the amplified signal and distortion signals produced by the amplifier. A portion of the output of the amplifier is placed on a coupling path and combined at the distortion isolation point with a delayed version of the signal on the second path to isolate the distortion produced from the amplifier. The gain & phase circuit is controlled to adjust the gain and phase of the signal such that the signal at the distortion isolation point is substantially the inverse (equal in amplitude but 180° out of phase) of the delayed input signal on the feed forward path. The control signal appearing on the control path of the gain & phase circuit is derived from the portion of the amplified signal with distortion on the coupling path and the delayed version of the signal on the feed forward path.

24 Claims, 4 Drawing Sheets

AUTOMATIC GAIN AND PHASE CONTROLLED FEEDFORWARD AMPLIFIER WITHOUT PILOT SIGNAL

BACKGROUND OF THE INVENTION

1. Field of the Invention

This invention relates to amplifiers and, more particularly, to a pilotless feed forward distortion reduction system.

2. Description of Related Art

Amplifiers often add undesired distortion to a signal, creating an output signal comprising distortion or nonlinear components and the signal component. The distortion includes any undesired signals added to or affecting adversely the input signal. There is therefore a need to devise techniques that can eliminate substantially or reduce significantly the distortion produced by the amplifier.

Feed-forward correction is routinely deployed in modem amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of input RF carrier pattern as well as the resultant distortion location, a known frequency component, i.e. a pilot signal, is injected in the main signal path to mimic the distortion produced by the amplification process. In feed-forward amplifiers, the feed forward distortion reduction circuitry minimizes the pilot signal along with the distortion. As such, by designing the feed forward distortion reduction circuitry to detect and cancel the pilot, the distortion can also be removed.

Figure 1:
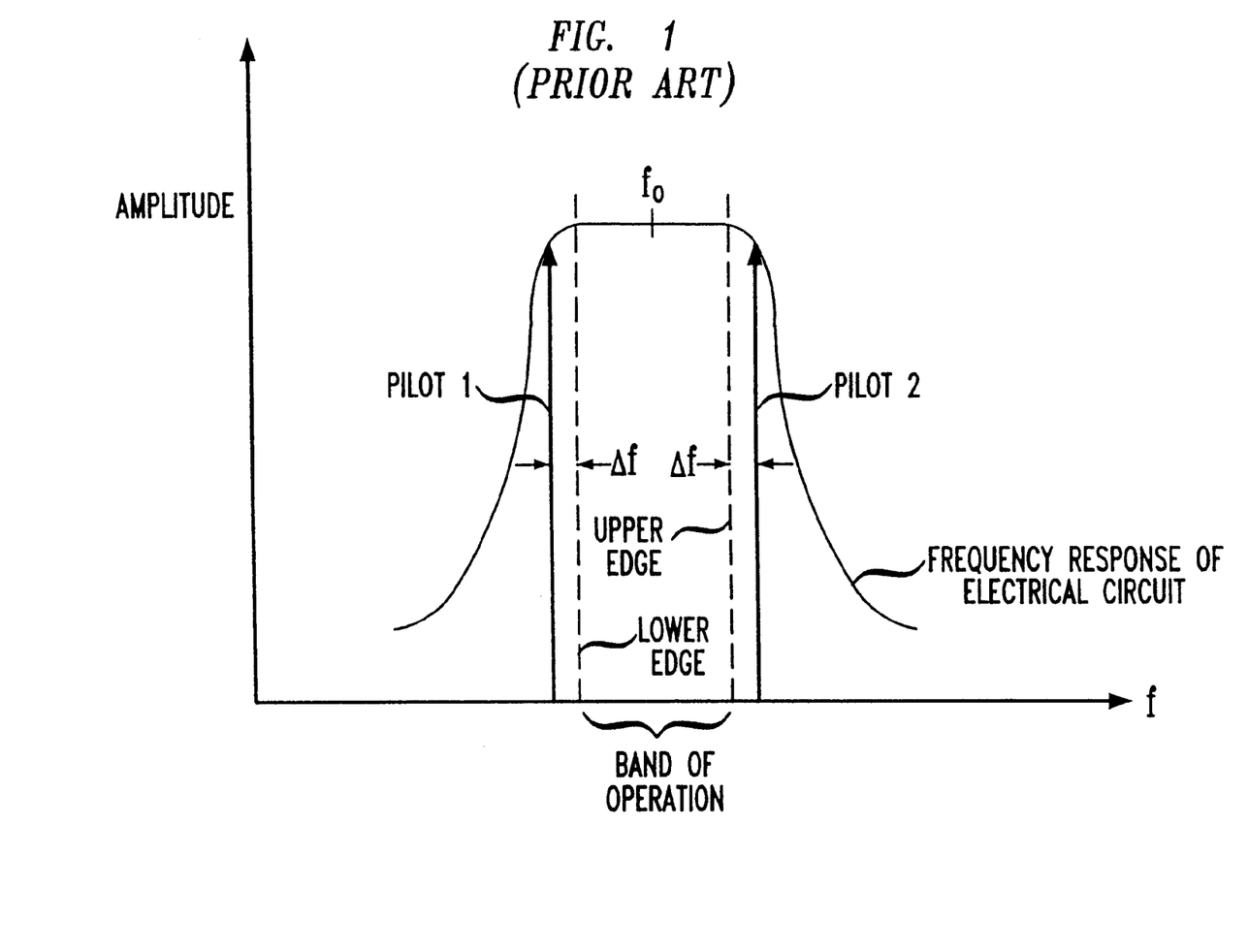
FIG. 1 shows an example frequency response curve of an RF amplifier showing the frequency within which the amplifier is operating.

The pilot signal is an electrical signal comprising at least one frequency component spectrally located near the frequency band of operation of the electrical circuit. A more complete description of the pilot signal is shown in FIG. 1 which shows the frequency response of a radio frequency (RF) amplifier including the location of the pilot signal. The pilot signal can be near the lower edge of the operating band (e.g., pilot 1) or located near the upper edge of the band of operation (e.g., pilot 2). Tie pilot is positioned a spectral distance of $\Delta f$ from an edge of the band of operation whose center frequency is $f_0$. The pilot signal can also be located somewhere within the band of operation of the RF amplifier. The electrical characteristics (e.g., amplitude, phase response, spectral content) of the pilot signal are known. It should be noted that although the pilot signal is shown as a single spectral component of a certain amplitude, the pilot signal can comprise a plurality of spectral components having various amplitudes.

Figure 2:
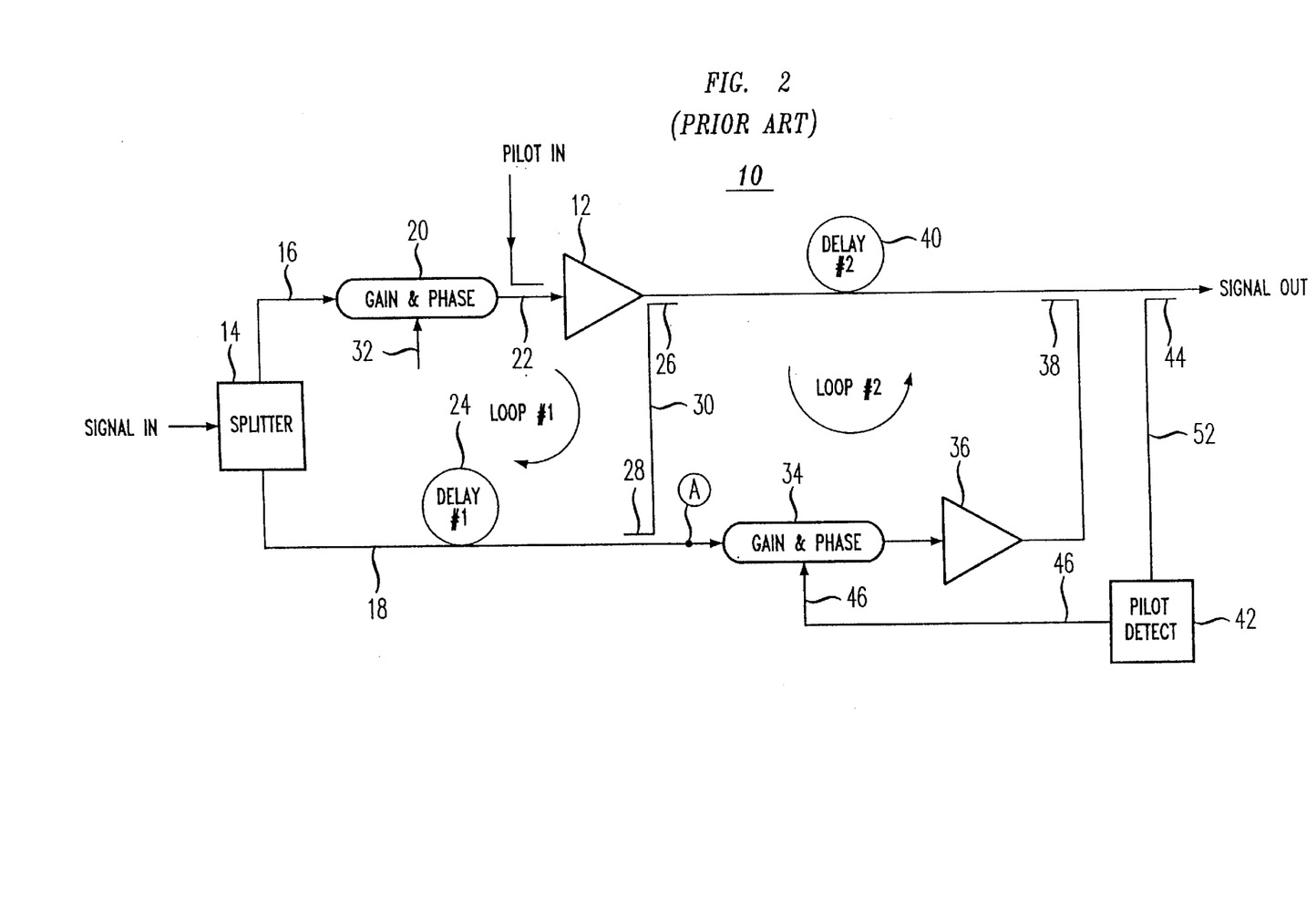
FIG. 2 is a block diagram of a prior art feed forward distortion correction scheme used for RF amplifiers.

The feed forward distortion reduction circuitry reduces distortion produced by the RF amplifier by applying the pilot signal to the RF amplifier and making adjustments based on information obtained from the applied pilot signal. FIG. 2 discloses feed-forward correction circuitry 10 and its use of information obtained from the pilot signal to reduce distortion produced by RF amplifier 12. An input signal is applied to a splitter 14. The splitter 14 replicates the input signal on a main signal path 16 and a feed forward path 18. The splitter 14 is part of a feed forward loop referred to as loop #1, which in addition to the splitter 14, comprises gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to interfere with the operation of the amplifier 12. The output of coupler 22 is applied to the amplifier 12 whose output comprises the amplified input signal, the amplified pilot signal and distortion signals produced by the amplifier 12. A portion of the output of the amplifier 12 is obtained from the coupler 26 and is combined with a delayed version of the input signal (signal on path 18) at the coupler 28 via coupling path 30. The signal on the path 18 has experienced sufficient delay provided by delay circuit 24 so that such signal experiences the same delay as the signal appearing at the coupler 28 via the path 30.

The gain & phase circuit 20 is controlled via control path 32 with control signals to adjust the gain and phase of the signal such that the signal appearing at the coupler 28 via the path 30 is substantially the inverse (equal in amplitude but 180° out of phase) of the delayed input signal at the coupler 28. The control signal appearing on the control path 32 of the gain & phase circuit 20 is derived from the signal at point A in a well known manner such as the use of detection circuits. The detection circuits detect well known electrical signal characteristics such as amplitude, phase, and frequency of the signal. Therefore, the input signals applied to the coupler 28 substantially cancel each other leaving at point A the pilot signal and the intermodulation distortion signals produced by the amplifier 12. Loop #1 is thus a feed forward loop which serves to isolate at point A the pilot signal and distortion signals produced by the amplifier 12.

The signals appearing at point A (pilot signal and distortion signals) are fed to gain & phase circuit 34 whose output is fed to amplifier 36 whose output is applied to coupler 38. A portion of the output signals (signal, pilot signal and distortion signals) of the amplifier 12 is fed to delay circuit 40 whose output is fed to the coupler 38. The delay circuit 40 is designed such that signals from the output of the amplifier 12 applied to the coupler 38 experience substantially the same delay as the signals from the output of the amplifier 36 applied to the coupler 38.

Because the frequency, amplitude and other electrical characteristics of the pilot signal are known, pilot detect circuit 42 can use detection circuits such as a mixer connected to a log detector (or other well known detection circuits) to detect the pilot signal or a portion of the pilot signal via coupler 44. The pilot signal is used to obtain information about the distortion produced by the amplifier 12. The information is obtained by detecting well known electrical signal characteristics of the pilot signal. In particular, the characteristics (e.g., amplitude, spectral content, phase response) of the pilot signal are known and thus when the pilot detect circuit 42 detects the pilot signal, some or all of the known characteristics can be used to isolate the pilot signal. Detection circuit 42 will detect the pilot signal and use this information to generate control signals onto path 46 to cause the gain & phase circuit 34 to modify the pilot signal at point A such that the pilot signal on the main path 16 at the coupler 38 is substantially the inverse (equal in amplitude but 180° out of phase) of the pilot signal on the feed forward path 18 at the coupler 38. The corresponding pilot signals and the distortion signals at the coupler 38 substantially cancel each other at the coupler 38 leaving the signal (or an amplified version of the signal) at the output of the system. Therefore, loop #2, which comprises the coupler 26, the coupler 28, the gain & phase circuit 34, the amplifier 36, the coupler 38 and the delay circuit 40 is a feed forward loop which uses the information obtained from the pilot signal to cancel substantially the distortion produced by the amplifier 12.

In actual systems, however, there is rarely an absolute cancellation of the distortion and the pilot signals. Feed forward distortion reduction systems require tight operating tolerances, for example, to achieve a 30 dB reduction in IMDs, typical feed forward correction systems may require a + or −1 dB frequency flat response (amplitude deviation over the frequency band of operation) and a + or −1 degree phase linearity (phase deviation from a straight line in the frequency band of operation). To obtain this accuracy is difficult.

The amplitude of the pilot signal is typically relatively small at the output of the feed forward distortion reduction system because of the cancellation of the pilot and the relative amplitude of the pilot signal with respect to the amplitude of the output signal. Thus, it becomes difficult to detect the pilot signal at the output of the system. To improve detection of the pilot signal at the output of the correction circuitry, schemes are developed to place the pilot signal at an appropriate location and to improve detection.

Thus, a need exists for a distortion reduction system that can provide adequate distortion reduction while eliminating the need for the pilot signal to reduce distortion.

SUMMARY OF THE INVENTION

The present invention involves a pilotless feed forward distortion reduction system which uses phase and gain control based on the phases and amplitudes of combining signals prior to a distortion isolation point to maintain the relationship between the phase and amplitudes of combining signals. For example, the feed forward arrangement receives a signal to be amplified on a main signal path and replicates the signal onto a main signal path and a feed forward path. The signal on the main signal path is applied to a gain & phase circuit. The output of gain & phase circuit is applied to the amplifier whose output comprises the amplified signal and distortion signals produced by the amplifier. A portion of the output of the amplifier is placed on a coupling path and combined at the distortion isolation point with a delayed version of the signal on the feed forward path to isolate the distortion produced from the amplifier. The gain & phase circuit is controlled to adjust the gain and phase of the signal such that the signal at the distortion isolation point is substantially the inverse (equal in amplitude but 180° out of phase) of the delayed input signal on the feed forward path. The control signal appearing on the control path of the gain & phase circuit is derived from the portion of the amplified signal with distortion on the coupling path and the delayed version of the signal on the feed forward path. Thus, a pilot signal is not needed because the desired relationship between the phase and gain of the combining signals is maintained to achieve sufficient cancellation of the signal and to isolate at the distortion produced by the amplifier after the distortion isolation point. The distortion of the feed forward path is fed forward to reduce the distortion on the main signal path.

In certain embodiments, the distortion reduction system uses multiple pilotless feed forward reduction stages, each of which uses the gain and phase control based on the phase and amplitude of the combining signals at the respective distortion isolation points, to reduce the distortion from the output of the RF amplifier. For example, a feed forward distortion reduction system reduces the distortion from the output of an RF amplifier by performing two feed forward reductions on the distortion produced from the RF amplifier. A first feed forward reduction stage, which includes the RF amplifier, produces the amplified signal with distortion. A portion of the amplified signal with distortion is placed on a coupling path and combined at the distortion isolation point with a delayed version of the signal on the feed forward path to isolate the distortion produced from the amplifier because a gain & phase circuit adjusts the gain and phase of the signal such that the amplified signal at the input signal cancellation point is substantially the inverse (equal in amplitude but 180° out of phase) of the delayed input signal on the second path. The gain & phase circuit makes gain and phase adjustments based on the phases and amplitudes of the portion of the amplified signal on the coupling path and the delayed version of the signal on the feed forward path to isolate the distortion which is fed forward to reduce the distortion remaining on the main signal path. A second feed forward reduction stage receives as the input signal the reduced distortion and any additional distortion from the first feed forward reduction stage. The second feed forward stage uses gain and phase control based on the amplitudes and phases of the combining signals prior to the distortion isolation point for the second feed forward stage to produce an amplified version of the distortion from the first feed forward stage. The output of the second feed forward stage is fed forward to further reduce the distortion from the amplified signal on the main signal path.

BRIEF DESCRIPTION OF THE DRAWINGS

Other aspects and advantages of the present invention may become apparent upon reading the following detailed description and upon reference to the drawings in which.

DETAILED DESCRIPTION

Figure 3:
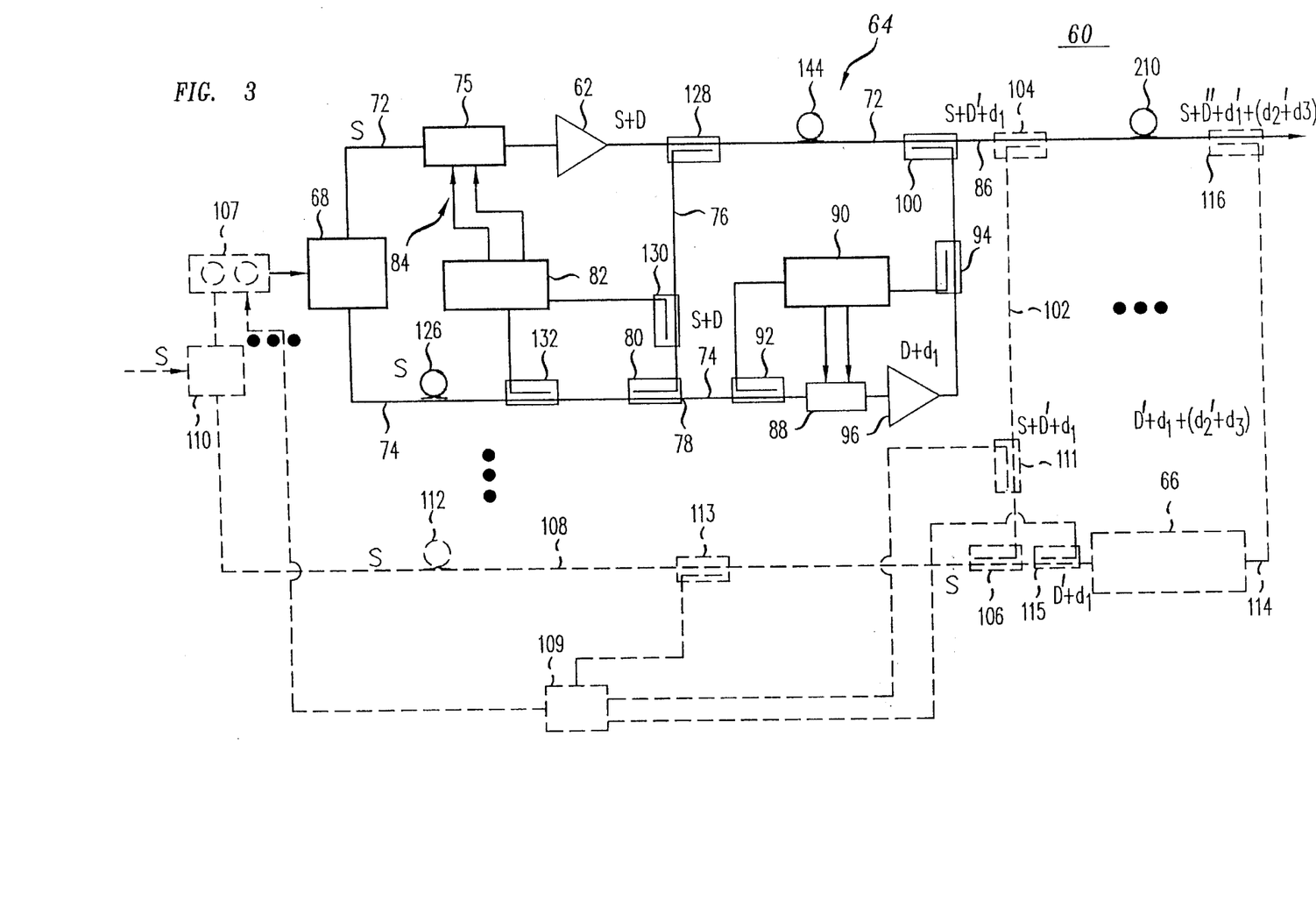
FIG. 3 shows a general block diagram of a pilotless feed forward distortion reduction system using gain and phase control according to the principles of the present invention.

An illustrative embodiment of a pilotless feed forward distortion reduction system according to the principles of the present invention is described below. FIG. 3 shows a general block diagram of a feed forward distortion reduction system 60 which does not use a pilot to reduce the distortion from the output of an RF amplifier 62. FIG. 3 shows a feed forward distortion reduction stage 64 which itself can be referred to as the pilotless feed forward reduction system according to the principles of the present invention, but the feed forward reduction system 60 is shown as being able to include multiple feed forward stages, such as a second feed forward reduction stage 66. Additional feed forward reduction stages (not shown) can be used as would be understood by one of skill in the art with the benefit of this disclosure. The feed forward distortion reduction stage 64 receives from a splitter 68 a signal S to be amplified on a main signal path 70 and replicates the signal S onto a main signal path 72 and a feed forward path 74. The signal S on the main signal path 72 is applied to a gain & phase circuit 75. The output of gain & phase circuit 75 is applied to the amplifier 62 whose output comprises the amplified signal S with distortion D produced by the amplifier 62. A portion of the output S and D of the amplifier 62 is placed on a coupling path 76 and combined at the distortion isolation point 78 (shown as the coupler 80) with a delayed version of the signal S on the path 74 to isolate the distortion D produced from the amplifier 62.

The gain & phase circuit 75 is controlled by a phase and gain controller 82 to adjust the gain and phase of the signal S on the main signal path 72 prior to the amplifier 62 such that the amplified signal S and D at the coupler 80 is substantially the inverse (equal in amplitude but 180° out of phase) of the delayed signal S on the path 74. The control signal(s) appearing on the control path(s) 84 of the gain & phase circuit 75 is derived from the portion of the amplified signal S and D on the coupling path and the delayed version of the signal S on the path 74. Because the desired amplitude and phase relationship (for example, the combining signals have the same amplitude and are 180 degrees out of phase) is maintained between the combining signals, the combining signals S sufficiently cancel to isolate the distortion D at the distortion isolation point 78. As such, the use and detection of a pilot signal after the distortion isolation point 78 is not required to adjust the phase and gain of the gain and phase circuit 75.

As the cancellation of the combining signals S improves, the feed forward distortion reduction improves the isolation of the distortion D on the second path 74 at the distortion isolation point 78. The feed forward distortion reduction stage 64 feeds forward the isolated distortion D on the path 74 to reduce the distortion D on the main signal path 72. As such, the improved isolation of the distortion D at the distortion cancellation point 78 can lead to improving the reduction of the distortion D from the output 86 of the stage 64. In this embodiment, the output of the coupler 80 is applied to a gain & phase adjuster 88 which adjusts the signal D according to phase and gain control signals from a gain and phase control circuit 90. The phase and gain control circuit 90, such as an automatic gain and phase control circuit as described in the patent application entitled "Feed Forward Amplifier Improvement Incorporating An Automatic Gain and Phase Controller" filed concurrently with the present application and assigned to the same assignee and herein incorporated by reference, provides the gain and phase control signals in response to inputs received from the couplers 92 and 94. The coupler 92 is on the path 74 prior to the amplifier 96, and the coupler 94 is located after the amplifier 96.

The output of gain and phase adjuster 88 is applied to the amplifier 96 whose output comprises the amplified signal D and distortion signals $d_1$ produced by the amplifier 96. The stage 64 is amplified such that corresponding portions of the signals D applied to a coupler 100 destructively combine to produce at the output 86 of the stage 64 the amplified signal S with reduced distortion D' (and distortion $d_1$). As mentioned above for the feed forward reduction system of FIG. 2 which uses a pilot signal and detection circuitry, tight tolerances are required in the performance of the stage 64 to achieve a 30 dB reduction in the distortion. If the goal is changed from a 30 dB reduction of the distortion at the output 86 of the stage 64 to a 20 or 25 dB reduction in the distortion at the output 86 of the stage 64, the problem becomes less difficult.

In certain embodiments, the distortion reduction system uses multiple pilotless feed forward reduction stages according to the principles of the present invention to further reduce the distortion from the output of the RF amplifier 62. For example, the second feed forward reduction stage 66 receives as the input signal the reduced distortion D and any additional distortion dl from the first feed forward reduction stage 64 via a second coupling path 102. A coupler 104 couples a portion of the signal S with distortion D' and d1 from the main signal path 78 onto the second coupling path 102. A coupler 106 receives the signal S with distortion D' and $d_1$ from the coupling path 102 and combines the signal S and the distortion D' and $d_1$ from the coupling path 102 with a delayed signal S on a path 108 which was obtained from splitter 110. In this embodiment, the splitter 110 receives the signal S and provides versions of the signal S to a phase and gain adjuster 107 prior to the splitter 68 of the first feed forward stage 64 and the path 108. The signal S on the path 108 is delayed by a delay 112. The signal S on the path 108 experiences sufficient delay provided by the delay circuit 112 such that signal S experiences the same delay as the signal S appearing at the coupler 106 via the path 102. The coupler 106 destructively combines the signal S from the second coupling path 102 and the signal S from the path 108 and isolates the remaining distortion D' and $d_1$ from the first feed forward arrangement 64 on the path 108 leading to the second feed forward arrangement 66.

In accordance with certain aspects of the present invention, the gain & phase adjuster 107 is controlled by a phase and gain controller 109 to adjust the gain and phase of the signal S prior to the amplifier 12 such that the amplified signal S, D' and d1 at the coupler 106 is substantially the inverse (equal in amplitude but 180° out of phase) of the delayed signal S on the path 108. In some embodiments, the gain and phase control circuit 109 provides control signal(s) to the gain & phase circuit 107 derived from the portion of the amplified signal S, D' and d1 on the second coupling path 102 provided by a coupler 111 and the delayed version of the signal S on the path 108 provided by a coupler 113. Because the desired amplitude and phase relationship (for example, the combining signals have the same amplitude and are 180 degrees out of phase) is maintained between the combining signals, the combining signals S sufficiently cancel to isolate the distortion D at the coupler 106. In other embodiments, the gain and phase control circuit 109 can be a logarithmic detector and a nulling circuit. In such an embodiment, a coupler 115 produces a sample of the signal after the output of the coupler 106 to the log detector which produces a signal indicative of the amplitude of the signal. A nulling circuit attempts to reduce the signal from the log detector to improve cancellation of the signal and isolate the distortion after the coupler 106 by providing control signals to the phase and gain adjuster 107.

In this embodiment, the second feed forward arrangement 66 as well as any additional feed forward stages (not shown) is configured to operate as described above for the first feed forward stage 64. As such, the second feed forward stage uses gain and phase control of the combining signals at the distortion isolation point for the second feed forward stage to produce an amplified version of D and d1 which is fed forward to further reduce the distortion D' and d1 from the amplified signal S. Accordingly, at the output 114 of the second feed forward stage 66, an amplified distortion signal D and $d_1$ (as well as any minor distortion signals introduced by the amplifiers (not shown) in the second feed forward stage 66) are provided to a coupler 116. The coupler 116 combines the distortion signals D' and $d_1$ from the second feed forward stage 66 with a delayed version of the signals S with distortion D' and $d_1$ on the main signal path 72 to further reduce the distortion D' produced from the first feed forward stage 64 as well as the residual distortion d1. The signals S with distortion D' and $d_1$ are fed to a delay circuit 118 which is designed such that signals from the outputs of the coupler 104 applied to the coupler 116 experience substantially the same delay. Using gain and phase control circuits in the second stage 66 as described for the first stage maintain the signals at the appropriate phase and gain relationship for sufficient combining of signals without the need for a pilot signal.

Assuming a 20 dB reduction in the IMDs per feed forward correction stage 64 and 66, the feed forward distortion reduction system 60 can achieve the typical 30 dB reduction goal without the need of a pilot signal and the corresponding control and detection circuitry. In fact, with two feed forward correction arrangements 64 and 66 providing 20 dB of reduction per loop, the system 60 can provide 40 dB reduction in the IMDs. Accordingly, the system 60 enables the main amplifier 62, which was typically limited to 30 dBc IMDs, to be pushed to 20 dBc IMDs, thereby improving efficiency.

Figure 4:
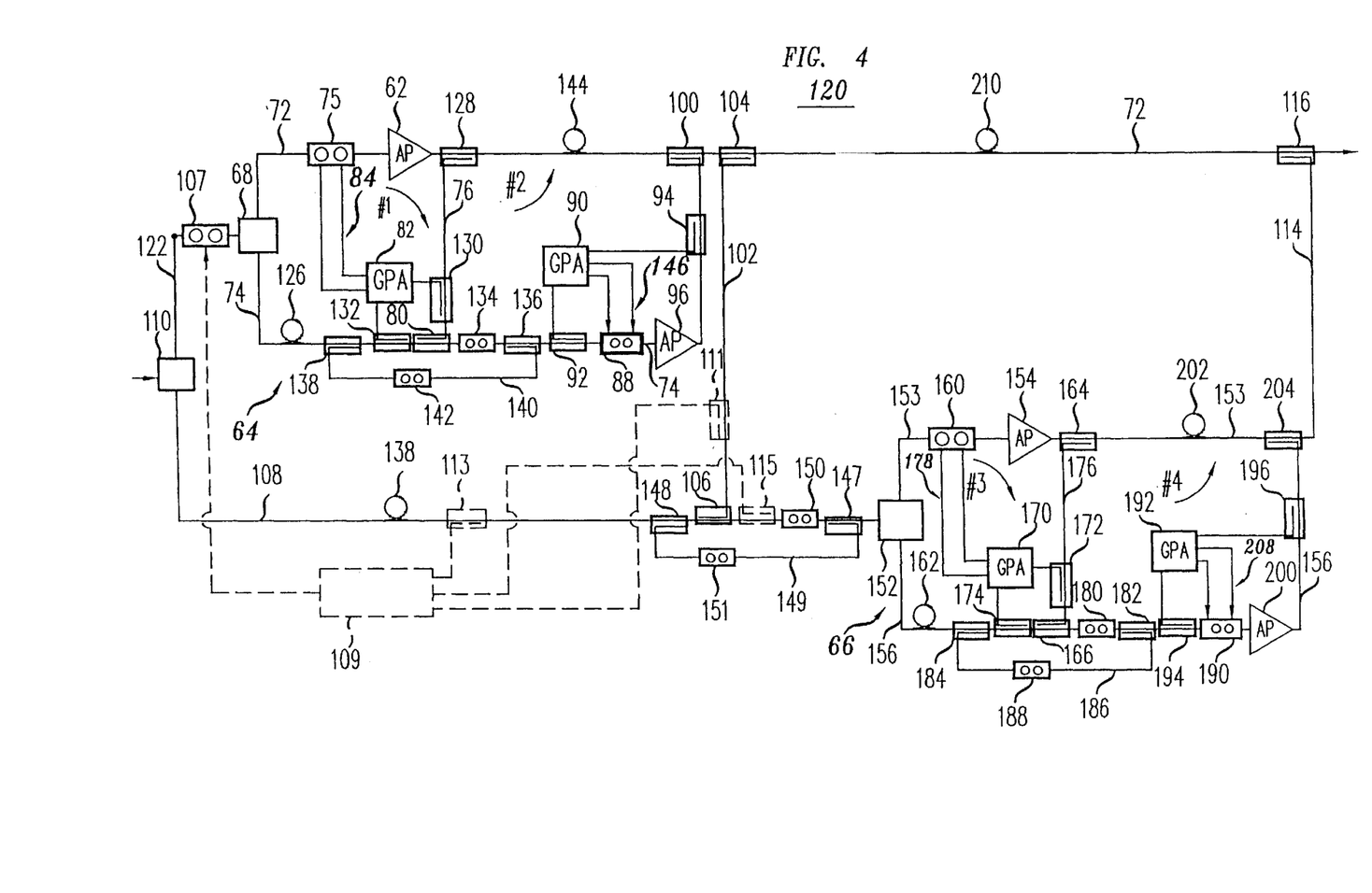
FIG. 4 shows a particular embodiment of a feed forward distortion reduction system using gain and phase control according to the principles of the present invention.

FIG. 4 shows a detailed implementation of a multiple feed forward distortion reduction system 120 according to FIG. 3. In FIG. 4, a signal S is received by the feed forward system 120, and the splitter 110 replicates the signal S onto a first path 122 leading to the first feed forward arrangement 64 and onto a second path 108 leading to the second feed forward arrangement 66. On the first path in this embodiment, the gain and phase adjuster 107 adjusts the phase and amplitude of the signal S on the first path 122, and the splitter 68 replicates the signal S from the phase and gain adjuster 124 on the first path 122 onto the main signal or third path 72 leading to the amplifier 62 and the feed forward or fourth path 74. The splitter 76 is part of a feed forward loop referred to as loop #1, which in addition to the splitter 68, includes gain & phase circuit 75, the RF amplifier 62, delay circuit 126 and couplers 80 and 128. The signal on the third path 72 is applied to the gain & phase adjuster 75 which adjusts the phase and gain of the signal S on the third path 72 according to phase and gain control signals from the gain and phase control circuit 82. The phase and gain control circuit 82, such as an automatic gain and phase control circuit, provides the gain and phase control signals 84 in response to inputs received from the couplers 130 and 132. The coupler 130 provides a sample of the amplified signal S and distortion D on the coupling path 76, and the coupler 132 provides a sample of the signal S on the fourth path 74 prior to the distortion isolation point 78 at the coupler 80.

The output of gain and phase adjuster 82 is applied to the amplifier 62 whose output comprises the amplified signal S and distortion signals D, such as third order IMDs produced by the amplifier 62. A portion of the output of the amplifier 62 is obtained from the coupler 128 and is combined with a delayed version of the signal S (signal S on the fourth path 74) at the coupler 80 via coupling path 76. The signal S on the path 74 has experienced sufficient delay provided by the delay circuit 126 so that such signal S experiences the same delay as the signal S appearing at the coupler 80 via the path 76.

The gain & phase circuit 75 is controlled by the gain and phase control circuit 82 via control path 84 with at least one control signal to adjust the amplitude and/or phase of the signal S such that the signal S appearing at the coupler 80 via the path 76 is substantially the inverse (equal in amplitude but 180° out of phase) of the delayed input signal at the coupler 80. In this embodiment, the control signal(s) appearing on the control path 84 of the gain & phase circuit 82 are derived from the signals at the couplers 130 and 132 using amplitude and phase detectors to compare the phases and amplitudes of the combining signals (the amplified signal S and distortion D on the coupling path 76 and the signal S on the fourth path 74). The control circuit 82 maintains the same gain and phase relationship between the combining signals, (for example, equal phase and 180 degrees phase difference) to achieve sufficient cancellation at the coupler 80. The control circuit 82 can be the automatic gain and phase control circuit described in the patent application entitled "Feed Forward Amplifier Improvement Incorporating An Automatic Gain and Phase Controller" filed concurrently with this application and assigned to the same assignee. In general, a phase difference of 179 to 181 degrees and an amplitude difference of + or −0.1 dB between the combining signals can achieve a cancellation of 30 dB, and a 175–185 degree phase difference and a 2 dB amplitude difference can provide almost 20 dB of cancellation.

In this embodiment, a remaining signal S can appear at the output of the coupler 80 (along with distortion D), and an improved combination of the remaining signal S (leakage signal S) and the signal S from the path 74 is made at the coupler 136. For example, after the coupler 80, some leakage signal S can remain on the path 74. As such, a coupler 138 couples a portion of the signal S from the path 74 prior to the coupler 80 onto the coupling path 140. A phase and gain circuit 134 adjusts the phase and amplitude of the remaining signal S with distortion D from the output of the coupler 80, and a phase and gain circuit 142 adjusts the phase and amplitude of the signal S on the coupling path 140. The phase and gain circuits 134 and 140 respectively adjust the phase and amplitude of the signal S from the coupler 80 and the signal S on the coupling path 140 to improve the reduction of the remaining signal S from the output of the coupler 80. The remaining signal S output from the phase and gain circuit 134 destructively combines with the signal S on the coupling path 140. The combination at the coupler 136 is made such that any remaining signal S is from the signal S from the path 74 rather than from the coupling path 76. As such, the coupler 136 provides the distortion D as the prominent signal on the path 74, and any remaining signal S can be fed forward along with the distortion signal to constructively combine with the amplified signal S on the main signal path 72.

The output of the coupler 136 is applied to the gain & phase adjuster 88 which adjusts the signal D according to phase and gain control signals from a gain and phase control circuit 90. In this embodiment, the phase and gain control circuit 90 provides the gain and phase control signals in response to inputs received from the couplers 92 and 94. The output of gain and phase adjuster 88 is applied to the amplifier 96 whose output comprises the amplified signal D and residual distortion signals d produced by the amplifier 96.

At the output of the coupler 128 on the main signal path 72, a portion of the output signals (amplified signal S and distortion signals D) of the amplifier 62 is fed to delay circuit 144 whose output is fed to a coupler 100. The delay circuit 144 is designed such that signals from the output of the amplifier 62 applied to the coupler 100 experience substantially the same delay as the signals from the output of the amplifier 96 applied to the coupler 100. The gain & phase circuit 88 is controlled via control path 146 with at least one control signal to adjust the amplitude and/or phase of the signal D on the feed forward path 74 such that the signal S appearing at the coupler 100 is substantially the inverse (equal in amplitude but 180° out of phase) of the delayed input signal S at the coupler 130. In this embodiment, the control signal(s) appearing on the control path 146 of the gain & phase circuit 88 is derived from the signals at the couplers 92 and 94 in a manner as described in the patent application entitled "Feed Forward Amplifier Improvement Incorporating An Automatic Gain and Phase Controller" filed concurrently with this application and assigned to the same assignee. Therefore, the signals D applied to the coupler 100 destructively combine leaving at the output of the coupler 100 the signal S with reduced distortion D'. The reduced distortion D' can include dynamic or residual distortion characteristics exhibited by many electrical circuits such as the amplifier 62 as well as distortion d1 produced by the amplifier 96. Loop #2 is thus a feed forward loop which reduces the distortion D produced by the amplifier 62 to produce the amplified signal S with reduced distortion D' on the main signal path 72.

The second feed forward reduction stage is used to further reduce the distortion from the output of the coupler 100. To do so, the coupler 104 receives the signal S with distortion D' and $d_1$ from the coupler 100. The coupler 104 couples a portion of the signal S with distortion D' and $d_1$ from the third path 72 onto the coupling path 102. The coupler 106 receives the signal S with distortion D' from the coupling path 102 and combines the signal S and the distortion D' and $d_1$ from the coupling path 102 with the delayed signal S on the path 108. The signal S on the path 108 is delayed by the delay 112. The signal S on the path 108 experiences sufficient delay provided by the delay circuit 112 so that such input signal S experiences the same delay as the signal S appearing at the coupler 106 via the path 102. The coupler 106 destructively combines the signal S from the coupling path 102 and the signal S from the path 108 to isolate the remaining distortion D' and $d_1$ from the first feed forward arrangement 64 on the path 108 leading to the second feed forward arrangement 66.

A remaining signal S can appear at the output of the coupler 106 (along with distortion D and $d_1$), and an improved combination of the remaining signal S (leakage signal S) and the signal S from the path 108 is made at the coupler 147. For example, after the coupler 106, some leakage signal S can remain on the path 108. As such, a coupler 148 couples a portion of the signal S from the path 108 prior to the coupler 106 onto a coupling path 149. A phase and gain circuit 150 adjusts the phase and amplitude of the remaining signal S with distortion D from the output of the coupler 106, and a phase and gain circuit 151 adjusts the phase and amplitude of the signal S on the coupling path 149. The phase and gain circuits 150 and 151 respectively adjust the phase and amplitude of the signal S from the coupler 106 and the signal S on the coupling path 149 to improve the reduction of the remaining signal S from the coupler 106. The remaining signal S output from the phase and gain circuit 150 destructively combines with the signal S on the coupling path 140. The combination at the coupler 147 is made such that any remaining input signal S is from the signal S from the path 108 rather than from the coupling path 102. As such, the coupler 147 provides the distortion D as the prominent signal on the path 108, and any remaining signal S can be fed forward along with the distortion signal to constructively combine with the amplified signal S on the main signal path 72.

The coupler 147 provides the signal D' and $d_1$ to a splitter 152 which replicates the signal D' and $d_1$ on the path 108 onto a fifth path 153 leading to an amplifier 154 and onto a sixth path 156. The splitter 152 is part of a feed forward loop referred to as loop #3, which in addition to the splitter 152, includes gain & phase circuit 160, the RF amplifier 154, delay circuit 162 and couplers 164 and 166. The signal D' on the fifth path 153 is applied to the gain & phase adjuster 160 which adjusts the phase and gain of the signal D' on the fifth path 153 according to phase and gain control signals from a gain and phase control circuit 170. In this embodiment, the phase and gain control circuit 170 provides the gain and phase control signals in response to inputs received from the couplers 172 and 174. The coupler 172 provides a sample of the amplified distortion D with d1 and distortion d2 from the amplifier 154, and the coupler 174 provides a sample of the signal D and d1 on the sixth path 156 prior to the distortion isolation point 166 at the coupler 166.

The output of gain and phase adjuster 160 is applied to the amplifier 154 whose output comprises the amplified signal D' and d1 and distortion d2 produced by the amplifier 154. A portion of the output of the amplifier 154 is obtained from the coupler 164 and is combined at the coupler 166 via coupling path 176 with a delayed version of the signal D' (and d1 on the sixth path 156). The signal D' and d1 on the sixth path 156 has experienced sufficient delay provided by the delay circuit 162 so that such signal D' and d1 experiences the same delay as the signal D', d1 and d2 appearing at the coupler 166 via the coupling path 176.

The gain & phase circuit 160 is controlled by the gain and phase control circuit 170 via control path 178 with at least one control signal to adjust the amplitude and/or phase of the signal D' and d1 such that the signal D' and d1 with d2 appearing at the coupler 166 via the path 176 is substantially the inverse (equal in amplitude but 180° out of phase) of the delayed input signal (D' and d1) at the coupler 166. In this embodiment, the control signal(s) appearing on the control path 178 of the gain & phase circuit 170 are derived from the signals at the couplers 172 and 174 using amplitude and phase detectors to compare the phases and gains of the combining signals (the amplified signal D' and d1 with distortion d2 on the coupling path 176 and the signal D' and d1 on the sixth path 156). The control circuit 170 maintains the same gain and phase relationship between the combining signals, (for example, equal phase and 180 degrees phase difference) to achieve sufficient cancellation at the coupler 166 without having to use a pilot signal to detect the pilot signal at the output to the coupler 166. The control circuit 82 can be the automatic gain and phase control circuit described in the patent application entitled "Feed Forward Amplifier Improvement Incorporating An Automatic Gain and Phase Controller" filed concurrently with this application and assigned to the same assignee. Therefore, the signal D' and d1 applied to the coupler 166 destructively combine to leave at the output of the coupler 166 the distortion d2 produced by the amplifier 154 and some remaining portion of the signal D' and d1. Loop #3 is thus a feed forward loop which tends to isolate the distortion d2 produced by the amplifier 154.

In this embodiment, a remaining signal D' and d1 can appear at the output of the coupler 166 (along with distortion $d_2$), and an improved combination of the remaining signal D' and d1 (leakage signal D' and d1) and the signal D' and d1 from the path 156 is made at the coupler 182. For example, after the coupler 166, some leakage signal D' and d1 can remain on the path 156. As such, a coupler 184 couples a portion of the signal D' and d1 from the path 156 prior to the coupler 166 onto a coupling path 186. A phase and gain circuit 180 adjusts the phase and amplitude of the remaining signal D' and d1 from the output of the coupler 166, and a phase and gain circuit 188 adjusts the phase and amplitude of the signal D' and d1 on the coupling path 186. The phase and gain circuits 180 and 188 respectively adjust the phase and amplitude of the signal D' and d1 and d2 from the coupler 166 and the signal D' and d1 on the coupling path 186 to improve the reduction of the remaining signal D' and d1 from the coupler 166. The remaining signal D' and d1 from the phase and gain circuit 180 destructively combines with the signal D' and d1 on the coupling path 186. The combination at the coupler 182 is made such that any remaining input signal D' and d1 is from the input signal D' and d1 on the path 156 rather than from the coupling path 176. As such, the coupler 166 provides the distortion d2 as the prominent signal on the path 156, and any remaining signal D' and d1 can be fed forward along with the distortion d2 to constructively combine with the amplified signal D' and d1 on the fifth path 153.

The output of the coupler 182 is applied to a gain & phase adjuster 190 which adjusts the signal D'' according to phase and gain control signals from a gain and phase control circuit 192. In this embodiment, the phase and gain control circuit 192, such as an automatic gain and phase control circuit as described in patent application entitled "Feed Forward Amplifier Improvement Incorporating An Automatic Gain and Phase Controller" filed concurrently with this application and assigned to the same assignee, provides the gain and phase control signals in response to inputs received from couplers 194 and 196. The output of gain and phase adjuster 190 is applied to the amplifier 200 whose output comprises the amplified signal d2 and distortion d3 produced by the amplifier 200.

At the output of the coupler 164 on the fifth path 152, a portion of the output signals (amplified distortion D' and d1 and distortion d2) of the amplifier 154 is fed to a delay circuit 202 whose output is fed to a coupler 204. The delay circuit 202 is designed such that signals from the output of the amplifier 154 applied to the coupler 204 experience substantially the same delay as the signals from the output of the amplifier 200 applied to the coupler 204.

The gain & phase circuit 190 is controlled via control path 208 with at least one control signal to adjust the amplitude and phase of the signal d2 on the sixth path 156 such that the signals d2 appearing at the coupler 204 is substantially the inverse (equal in amplitude but 180° out of phase) of the delayed signal D' and d1 at the coupler 204. In this embodiment, the control signal(s) appearing on the control path 208 of the gain & phase circuit 190 is derived from the signals at the couplers 194 and 196 as described in patent application entitled "Feed Forward Amplifier Improvement Incorporating An Automatic Gain and Phase Controller" filed concurrently with this application and assigned to the same assignee. Loop #4 is thus a feed forward loop which reduces the distortion d2 produced by the amplifier 154 from the fifth path 152 to produce the amplified distortion D' and d1 at the output 114 of the coupler 204. The reduced distortion d2' and d3 are negligible.

The coupler 204 provides the distortion D' and d1 to the coupler 116. The coupler 116 combines the amplified distortion D' and d1 from the second feed forward arrangement 66 (from the coupler 204) with a delayed version of the distortion D' and d1 on the main signal path 72 to further reduce the distortion D' produced from the coupler 104 on the third path 72. The distortion D' and d1 from the coupler 104 is fed to a delay circuit 210 which is designed such that signals D' from the outputs of the coupler 132 applied to the coupler 116 experience substantially the same delay. The coupler 116 destructively combines the distortion D' and d1 from the coupler 104 and the distortion D' and d1 to produce the signal S with reduced distortion D'' and d1'.

Using gain and phase control of combining signals at signal cancellation points to maintain the relative phase and amplitude between combining signals, a pilot signal is not necessary, and neither is the corresponding pilot detection circuitry and pilot control. Additionally, using automatic gain and phase control circuitry as described above as well as leakage signal combination circuitry in the feed forward arrangements for all and class AB amplifiers, improved performance is possible. Class A amplifiers, for example 1 Watt amplifiers, are always operating in a linear region, but typically big amplifiers, for example an amplifier rated at 100 Watts, can not always run in the linear region and are referred to as class AB. If an amplifier is rated at 1000 watts and the average power is 100 watts, the amplifier receives peaks of 1000 Watts but the peak to average power ratio is 10 dB. In the embodiment of FIG. 4, the amplifier 62 is a class AB amplifier rated at 1000 Watts. The amplifier 96 is a class AB amplifier rated at 1000 Watts. The amplifier 154 is a class AB amplifier rated at 10 Watts, and the amplifier 200 is a class AB amplifier rated at 1 watt. Certain amplifiers could be replaced with class A amplifiers, for example the amplifier 200.

In addition to the embodiments described above, alternative configurations of the multiple feed forward distortion reduction system according to the principles of the present invention are possible which omit and/or add components and/or use variations or portions of the described system. For example, FIG. 4 uses coupling paths 140, 149 and 186 to provide improved combination to remove destructive leakage signals at couplers 136, 147 and 182, respectively. Depending on the application, none of these coupling paths, additional coupling paths and/or different coupling path arrangements can be used. Additionally, the phase and/or gain of signals applied to coupler(s) 106 and/or 116 can be adjusted to improve the combination of the signals at the output of the coupler(s) 106 and/or 116 by maintaining the desired phase and/or amplitude relationship between combining signals based on a measurement of the phases and/or amplitudes of the combining signals according to aspects of the present invention.

The system has been described as using couplers, but other devices, such as 3 dB splitters and other coupling, signal splitting or sampling devices, can be used as well as other combining devices, such as summers. Additionally, the feed forward distortion reduction system is described with variable gain and phase adjusters controlled by phase and gain control circuits. Depending on the application, the gain and/or phase adjusters can be fixed and/or variable, and their location in the feed forward arrangements can change. The feed forward system has been further described as using different configurations of discrete components, but it should be understood that the feed forward system and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of reducing distortion in an amplified signal, said method comprising the steps of:

splitting a signal onto a main signal path and a feed forward path;

amplifying said signal from said main signal path via an amplifier to output an amplified signal with distortion on said main signal path;

obtaining a portion of said amplified signal with said distortion output from said amplifier;

adjusting the relative phase and amplitude between said portion of said amplified signal with said distortion and said signal on said feed forward path using inputs of said portion of said amplified signal with distortion and said signal on said feed forward path;

combining at a distortion isolation point said portion of said amplified signal with said distortion with said signal from said feed forward path to provide said distortion on said feed forward path; and using said distortion on said feed forward path to reduce distortion on said main signal path, wherein neither of said portion of said amplified signal with said distortion and said signal on said feed forward path includes a pilot signal.

2. The method of claim 1 wherein said step of using said distortion further including the steps of:

amplifying said distortion on said feed forward path;

adjusting said phase and amplitude of said distortion on said feed forward path based on the phase and amplitude of said distortion on said feed forward path after said distortion isolation point and on the phase and amplitude of said amplified distortion on said feed forward path; and combining said amplified distortion from feed forward path with said distortion on said main signal path to provide said reduced distortion on said main signal path.

3. The method of claim 2 further including the steps of:

splitting an input signal into a first path and a second path;

splitting said input signal from said first path onto said main signal path and said feed forward path;

obtaining a portion of said amplified signal with reduced distortion from said main signal path;

combining said portion of said amplified signal with said reduced distortion and said signal on said second path to produce said reduced distortion on said second path; and feeding forward said reduced distortion on said second path to further reduce said reduced distortion on said main signal path.

4. The method of claim 3 wherein said step of feeding forward further includes the steps of:

splitting said reduced distortion on said second path onto a fifth path and a sixth path;

amplifying said reduced distortion from said fifth path to produce said amplified reduced distortion with distortion d on said fifth path;

obtaining a portion of said amplified reduced distortion with said distortion d;

adjusting the relative phase and amplitude between said portion of said amplified reduced distortion with said distortion d and said reduced distortion on said sixth path based on said phases and amplitudes of said portion of said amplified reduced distortion with distortion d and said reduced distortion on said feed forward path;

combining at a second distortion isolation point said portion of said amplified reduced distortion with said distortion d with said reduced distortion from said sixth path to provide said distortion d on said sixth path; and using said distortion d on said sixth path to reduce said distortion d on said fifth path.

5. The method of claim 4 wherein said step of using said distortion d further including the steps of:

amplifying said distortion d on said sixth path to amplify said distortion d on said sixth path;

adjusting the phase and the amplitude of said distortion d based on the phase and amplitude of said distortion d on said sixth path after said second distortion isolation point and the phase and amplitude of said amplified distortion d on said sixth path; and combining said amplified distortion d from said sixth path with said reduced distortion and said distortion d on said fifth path to provide said reduced distortion on said fifth path.

6. The method of claim 5 wherein said step of using for including the step of:

combining said reduced distortion on said fifth path with said amplified signal and said reduced distortion on said main signal path to produce said amplified signal.

7. A distortion reduction system comprising:

a first splitting device configured to receive a signal and provide said signal to a main signal path and a feed forward path;

an amplifier on said main signal path for amplifying said signal from said main signal path to produce an amplified signal with distortion on said main signal path;

a coupling device on said main signal path provides a portion of said amplified signal with said distortion onto a first coupling path between the main signal path and the feed forward path;

a gain and phase control circuit configured to provide phase and gain control signals using inputs of said portion of said amplified signal with said distortion on said first coupling path and said signal on said feed forward path; and a gain and phase adjuster responsive to said phase and gain control signals to adjust the relative phase and amplitude between said portion of said amplified signal with said distortion and said signal on said feed forward path;

a combining device at a distortion isolation point on said feed forward path configured to combine said portion of said amplified signal with said distortion with said signal from said feed forward path to provide said distortion on said feed forward path; and a feed forward loop including said feed forward path configured to use said distortion on said feed forward path to reduce distortion on said main signal path, wherein neither of said portion of said amplified signal with said distortion on said first coupling path and said signal on said feed forward path includes a pilot signal.

8. The system of claim 7 wherein said feed forward loop further includes:

an amplifying device on said feed forward path amplifies said distortion on said feed forward path;

phase and gain adjustment circuitry configured to adjust the phase and amplitude of said distortion on said feed forward path based on the phase and amplitude of said distortion on said feed forward path after said distortion isolation point and the phase and amplitude of said amplified distortion on said feed forward path; and a second combining device on said main signal path configured to combine said amplified distortion from said feed forward path with said distortion on said main signal path to provide said reduced distortion on said main signal path.

9. The system of claim 8 further including:

a second splitting device configured to receive an input signal and splitting said input signal onto a first path and a second path;

said first splitting device spits said input signal from said first path onto said main signal path and said feed forward path;

a second coupling device configured to provide a portion of said amplified signal with reduced distortion from said main signal path onto a second coupling path;

a third combining device configured to combine said portion of said amplified signal with said reduced distortion and said signal on said second path to produce said reduced distortion on said second path; and a feed forward arrangement configured to receive said reduced distortion on said second path to further reduce said reduced distortion on said main signal path.

10. The system of claim 9 wherein said feed forward arrangement further including:

a third splitting device configured to receive said reduced distortion and splitting said reduced distortion onto a fifth path and a sixth path;

an amplifier on said fifth path for amplifying said reduced distortion from said fifth path to produce said amplified reduced distortion with distortion d on said fifth path;

a second gain and phase control circuit configured to provide phase and gain control signals based on the phase and amplitude of said portion of said amplified reduced distortion on said second coupling path with said distortion d and measurements of the phase and amplitude of said reduced distortion on said sixth path; and a second gain and phase adjuster responsive to said phase and gain control signals to adjust the relative phase and amplitude between said portion of said amplified reduced distortion with said distortion d and said reduced distortion on said sixth path;

a fourth combining device at a second distortion isolation point on said sixth path configured to combine said portion of said amplified reduced distortion with said distortion d with said reduced distortion from said sixth path to provide said distortion d on said sixth path; and a second feed forward loop including said sixth path configured to use said distortion d on said sixth path to reduce said distortion d on said fifth path.

11. The system of claim 10 wherein said second feed forward loop including:

an amplifying device on said sixth path amplifies said distortion d on said sixth path;

a second phase and gain adjustment circuitry configured to adjust the phase and amplitude of said distortion d on said sixth path based on the phase and amplitude of said distortion d on said sixth path after said distortion isolation point and the phase and amplitude of said amplified distortion d on said sixth path; and a fifth combining device on said fifth path configured to combine said amplified distortion d from said sixth path with said distortion d on said fifth path to provide said reduced distortion on said fifth path.

12. The system of claim 11 further including:

a sixth combining device on said main signal path configured to combine said reduced distortion on said fifth path with said amplified signal and said reduced distortion on said main signal path to produce said amplified signal.

13. A feed forward amplifier, comprising:

a splitter to receive a signal and provide the signal to a main signal path and a feed forward path;

an amplifier on the main signal path to produce an amplified signal with distortion;

a distortion isolation coupler on the feed forward path to combine a portion of the amplified signal with distortion at a first coupler input and the signal from the feed forward path at a second coupler input to produce a distortion signal on the feed forward path;

a gain and phase control circuit to provide gain and phase control signals using inputs of the signals at the first and second coupler inputs; and a gain and phase adjuster responsive to the gain and phase control signals to adjust a relative amplitude and phase between the signals at the first and second coupler inputs; and a feed forward loop including the feed forward path to use the distortion signal on the feed forward path to reduce distortion on the main signal path, wherein neither of the signals at the first and second coupler inputs includes a pilot signal.

14. The feed forward amplifier of claim 13, further comprising:

a coupling device on the main signal path to provide a portion of the amplified signal to the distortion isolation coupler.

15. The feed forward amplifier of claim 13, wherein the feed forward loop includes another amplifier on the feed forward path to produce a canceling distortion signal; an output coupler on the main signal path to combine the amplified signal with distortion and the canceling distortion signal to produce an output signal;

gain and phase control circuitry to adjust an amplitude and phase of the distortion signal input to the another amplifier based on the distortion signal and the canceling distortion signal.

16. The feed forward amplifier of claim 13, wherein the gain and phase control circuit operates to automatically hold signal components of the signals at the first and second coupler inputs equal in amplitude and 180 degrees out of phase.

17. The feed forward amplifier of claim 15, wherein the gain and phase control circuitry operates to automatically hold a distortion component of the amplified signal with distortion and the canceling distortion signal equal in amplitude and 180 degrees out of phase.

18. A feed forward amplifier, comprising:

a splitter to receive a signal and provide the signal to a main signal path and a feed forward path;

an amplifier on the main signal path to produce an amplified signal with distortion;

a distortion isolation coupler on the feed forward path to combine a portion of the amplified signal with distortion and the signal from the feed forward path to produce a distortion signal on the feed forward path;

another amplifier on the feed forward path to produce a canceling distortion signal;

an output coupler on the main signal path to combine the amplified signal with distortion and the canceling distortion signal to produce an output signal;

a gain and phase control circuit to provide gain and phase control signals using an input of the distortion signal and another input of the canceling distortion signal; and a gain and phase adjuster between distortion isolation coupler and the another amplifier to adjust an amplitude and phase of the distortion signal based on the gain and phase control signals, wherein neither of the distortion signal and the canceling distortion signal includes a pilot signal.

19. The feed forward amplifier of claim 18, further comprising:
   a coupling device on the main signal path to provide a portion of the amplified signal to the distortion isolation coupler.

20. The feed forward amplifier of claim 18, further comprising:
   gain and phase control circuitry to adjust an amplitude and phase of the signal input to the amplifier based on the portion of the amplified signal with distortion and the signal from the feed forward path input to the distortion isolation coupler.

21. The feed forward amplifier of claim 20, wherein the gain and phase control circuitry operates to automatically hold the amplified signal with distortion and the signal from the feed forward path input to the distortion isolation coupler equal in amplitude and 180 degrees out of phase.

22. The feed forward amplifier of claim 18, wherein the gain and phase control circuit operates to automatically hold a distortion component of the amplified signal with distortion and the canceling distortion signal equal in amplitude and 180 degrees out of phase.

23. A method of reducing distortion in an amplified signal, said method comprising the steps of:
   splitting a signal onto a main signal path and a feed forward path;
   amplifying said signal from said main signal path via an amplifier to output an amplified signal with distortion on said main signal path;
   obtaining a portion of said amplified signal with said distortion output from said amplifier;
   adjusting the relative phase and amplitude between said portion of said amplified signal with said distortion and said signal on said feed forward path based on said phase and amplitude of said portion of said amplified signal with distortion and said phase and amplitude of said signal on said feed forward path;
   combining at a distortion isolation point said portion of said amplified signal with said distortion with said signal from said feed forward path to provide said distortion on said feed forward path;
   amplifying said distortion on said feed forward path to reduce distortion on said main signal path;
   adjusting said phase and amplitude of said distortion on said feed forward path based on the phase and amplitude of said distortion on said feed forward path after said distortion isolation point and on the phase and amplitude of said amplified distortion on said feed forward path; and
   combining said amplified distortion from said feed forward path with said distortion on said main signal path to provide said reduced distortion on said main signal path.

24. The method of claim 23 further including the steps of:
   splitting an input signal into a first path and a second path;
   splitting said input signal from said first path onto said main signal path and said feed forward path;
   obtaining a portion of said amplified signal with reduced distortion from said main signal path;
   combining said portion of said amplified signal with said reduced distortion and said signal on said second path to produce said reduced distortion on said second path; and
   feeding forward said reduced distortion on said second path to further reduce said reduced distortion on said main signal path.

* * * * *